United States Patent
Candler

(10) Patent No.: US 11,239,849 B2
(45) Date of Patent: Feb. 1, 2022

(54) LOCKED LOOP CIRCUIT AND METHOD WITH MULTI-PHASE SYNCHRONIZATION

(71) Applicant: Movellus Circuits Incorporated, Ann Arbor, MI (US)

(72) Inventor: Frederick Christopher Candler, Toronto (CA)

(73) Assignee: Movellus Circuits Inc., Ann Arbor, MI (US)

( * ) Notice: Subject to any disclaimer, the term of this patent is extended or adjusted under 35 U.S.C. 154(b) by 0 days.

(21) Appl. No.: 16/840,642

(22) Filed: Apr. 6, 2020

(65) Prior Publication Data

US 2021/0313994 A1 Oct. 7, 2021

(51) Int. Cl.
H03L 7/099 (2006.01)
H03L 7/085 (2006.01)

(52) U.S. Cl.
CPC .......... H03L 7/0995 (2013.01); H03L 7/085 (2013.01)

(58) Field of Classification Search
CPC . H03L 7/00; H03L 7/085; H03L 7/087; H03L 7/0891; H03L 7/093; H03L 7/0995; H03L 7/10; H03L 7/18
USPC ....................................................... 327/156
See application file for complete search history.

(56) References Cited

U.S. PATENT DOCUMENTS

| | | | |
|---|---|---|---|
| 5,905,769 A * | 5/1999 | Lee | H04N 7/083 375/376 |
| 5,999,060 A | 12/1999 | Zuta | |
| 6,218,876 B1 | 4/2001 | Sung | |
| 6,275,553 B1 | 8/2001 | Esaki | |
| 6,424,192 B1 | 7/2002 | Lee | |
| 6,496,965 B1 | 12/2002 | van Ginneken | |
| 6,744,324 B1 | 6/2004 | Adams | |
| 6,826,247 B1 | 11/2004 | Elliott | |
| 7,216,249 B2 | 5/2007 | Fujiwara | |
| 8,117,576 B2 | 2/2012 | Mossawir | |
| 8,321,489 B2 | 11/2012 | Staszewski | |
| 8,427,205 B1 | 4/2013 | Nagaraj | |
| 8,791,734 B1 | 7/2014 | Hara | |

(Continued)

OTHER PUBLICATIONS

Seol, "A Reference Oversampling Digital Phase-Locked Loop", 2019 Symposium on VLSI Circuits Digest of Technical Papers, pp. 1-2.

*Primary Examiner* — Lincoln D Donovan
*Assistant Examiner* — Dave Mattison
(74) *Attorney, Agent, or Firm* — Lance Kreisman; Peninsula Patent Group

(57) ABSTRACT

A locked-loop circuit includes phase synchronization circuitry to synchronize a DCO clock phase to a reference clock phase. Sampling circuitry sequentially samples the reference clock with each of N sampling clocks having offset phases, a first one of the N sampling clocks comprising a master sampling clock. Edge detection logic accumulates phase information from the multiple sampling clocks and determines, based on the accumulated phase information, whether any of the sampling clocks other than the master sampling clock correspond to edge detection signals that occurred early with respect to a rising edge of the master sampling clock. Index logic generates index values for any of the determined early edge detection signals. The index logic transfers the generated index values to a master phase transfer logic unit. Phase adjust logic adjusts the master clock phase based on a selected one of the generated index values.

20 Claims, 5 Drawing Sheets

(56) References Cited

U.S. PATENT DOCUMENTS

| | | |
|---|---|---|
| 9,698,798 B1 | 7/2017 | Fredenburg |
| 2005/0189972 A1 | 9/2005 | Foo |
| 2007/0085622 A1 | 4/2007 | Wallberg |
| 2010/0244971 A1 | 9/2010 | Wang |
| 2013/0120036 A1 | 5/2013 | Zhu |
| 2013/0300477 A1 | 11/2013 | Ueda |
| 2016/0036454 A1 | 2/2016 | Moehlmann |
| 2016/0204787 A1 | 7/2016 | Lotfy |
| 2017/0193136 A1 | 7/2017 | Prasad |

* cited by examiner

LOCKED LOOP CIRCUIT AND METHOD WITH MULTI-PHASE SYNCHRONIZATION

TECHNICAL FIELD

The disclosure herein relates to locked loop circuits, and more particularly digital locked-loop circuits with adjustable parameters in response to changing environmental conditions.

BACKGROUND

Locked loop circuits, such as phase-locked loops, typically generate timing signals relative to an input reference signal. The locked loop circuitry adjusts the frequency of an output signal based on frequency and/or phase differences between the reference signal and the output signal. Based on any such difference, the frequency and/or phase of the output signal is increased or decreased accordingly. Phase-locked loops are used in a wide range of electronics, such as radios, telecommunication circuits, wireless and mobile devices, computers, and other devices.

In order to lock the output signal to the reference signal, the locked-loop circuit generally needs to transfer phase information from a digitally-controlled oscillator (DCO) to the reference clock domain. By doing so, a loop filter can speed-up or slow down the output signal, the DCO clock, so that its phase and frequency eventually match the reference clock. In practice, when sampling one clock with another, a small change in the sampling time can mean that the sampled clock appears "low" or "high" depending on when it is sampled. This difference in the state of the sampled clock introduces error into the system.

Accordingly, what is needed are methods, systems and associated apparatus that reduce error involved in sampling a locked-loop reference clock.

BRIEF DESCRIPTION OF THE DRAWINGS

Embodiments of the disclosure are illustrated by way of example, and not by way of limitation, in the figures of the accompanying drawings and in which like reference numerals refer to similar elements and in which.

DETAILED DESCRIPTION

Embodiments of locked-loop circuits and methods are provided. In one embodiment, a method of operation in a locked-loop circuit is disclosed. The locked-loop circuit includes a loop filter and a digitally-controlled oscillator (DCO) coupled to the output of the loop filter. The loop filter includes a first input to receive a digital word representing a difference between a reference clock frequency and a DCO output frequency. The method includes determining a calibration DCO codeword representing a calibration operating point for the locked-loop circuit; determining a scaling factor based on the calibration operating point, the scaling factor based on a ratio of an actual DCO gain to a nominal DCO gain; and applying the scaling factor to operating parameters of the loop filter.

Figure 1:
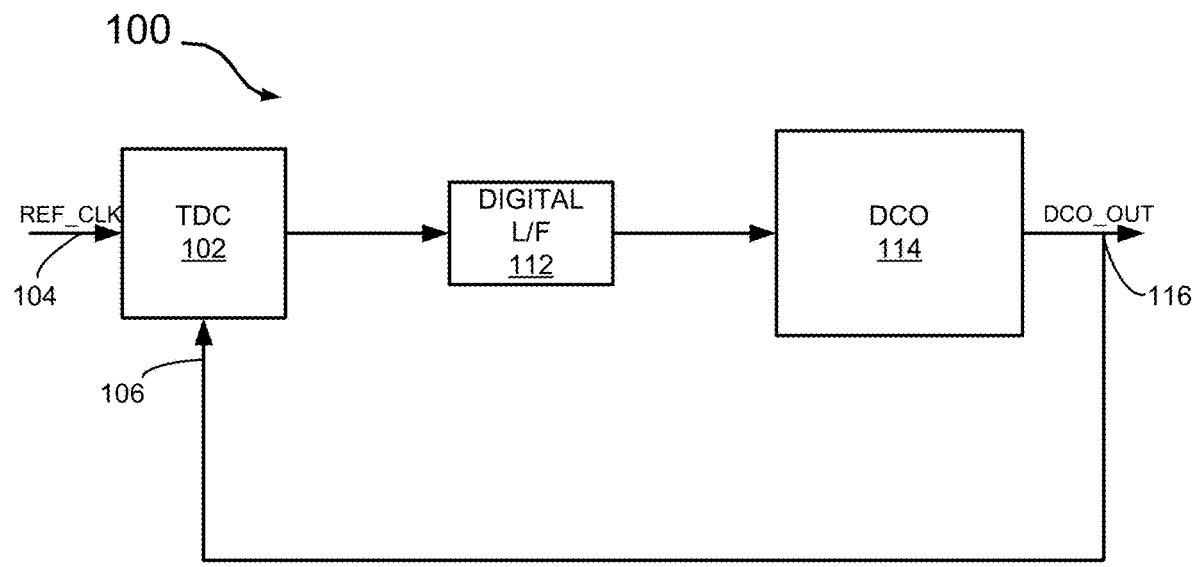
FIG. 1 illustrates one embodiment of a digital phase-locked loop (PLL).

FIG. 1 illustrates one embodiment of a digital phase-locked loop (PLL), generally designated 100, that may be used to generate a desired output timing signal, such as a clock signal. The PLL includes phase synchronization circuitry that, for one embodiment, comprises a time-to-digital converter (TDC) 102. The TDC receives as inputs a periodic reference clock signal REF_CLK, at 104, and a PLL clock output signal DCO_OUT, at 106. A digital loop filter 112 receives an output digital word from the TDC 102, representing the phase difference between the TDC input clocks, and employs processing circuitry to apply one or more digital filtering techniques to smooth the multi-bit digital word. The output of the digital loop filter is then fed to a digitally-controlled oscillator (DCO) 114, which generates the output timing signal DCO_OUT, at 116, that is fed back to the TDC to complete a control loop.

Figure 2:
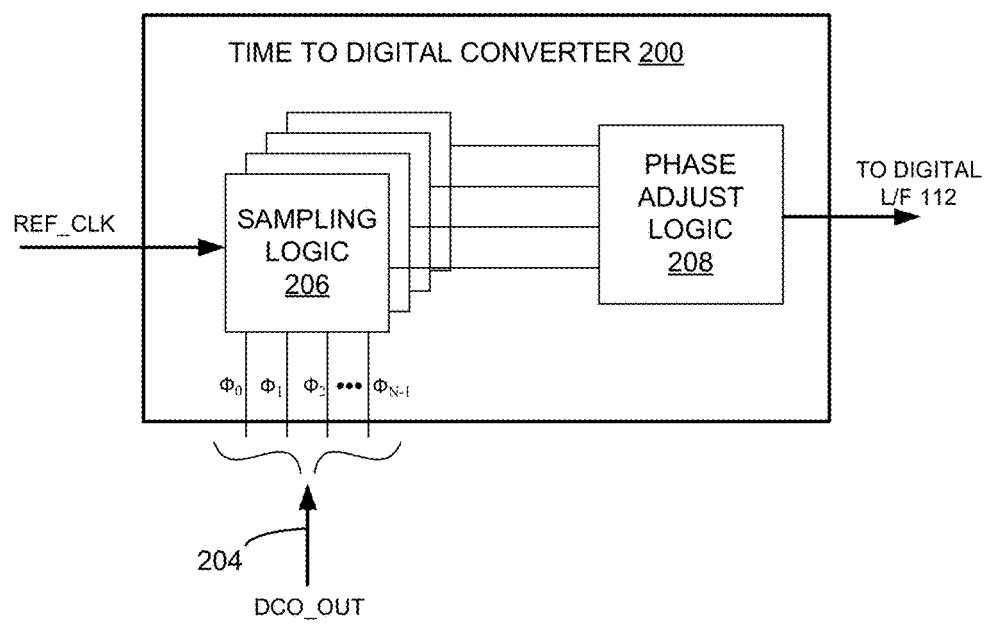
FIG. 2 illustrates a further detail of the time-to-digital converter (TDC) of FIG. 1.

With reference now to FIG. 2, for one embodiment, the phase synchronization circuitry, generally designated 200, receives the output timing signal DCO_OUT from the DCO, at 204, in the form of N isochronous sampling clock signals $\Phi_0$-$\Phi_{N-1}$. The sampling clock signals, in one embodiment, are generated by the DCO. For one embodiment, the number of sampling clocks is a $2^N$ value, with the respective phases nominally equally spaced apart within a single period of the sampling clock. In other embodiments, non power-of-two sampling clocks may be employed, but with a possible loss of precision, depending on the number of phases available. One of the N sampling clocks, such as the one corresponding to $\Phi_0$, is designated as a "master" sampling clock, for use in controlling PLL logic disposed downstream of the sampling logic. For one specific embodiment, a ring-oscillator configuration disposed in the DCO utilizing N–1 delay elements may generate the sampling clocks.

With continued reference to FIG. 2, the received multi-phase sampling clocks are fed to sampling logic 206 that employs a corresponding number of N samplers to sample the reference clock in response to rising edges of each sampling clock. The sampled signals are then further processed to generate edge detection signals, providing timing information indicating whether the sampled signal associated with a particular sampling clock phase indicated a logic "1" "early" or "late" with respect to a rising edge of the master sampling clock signal. Each "edge detection" signal represents sampling of the sampled signal that provides a more narrow timing window of when the rising edge of the reference clock occurred with respect to the sampling clock. The resulting edge detect signals from each sampling circuit, along with the respective sampling clock signals, are then transferred to phase adjust logic 208. While the embodiments described herein generally employ a rising edge detection scheme to detect logic "high" values, the detection of "low" values may also fall within the scope of concepts expressed herein. Further embodiments may employ falling edge detection schemes to detect low or high logic values.

Figure 3:
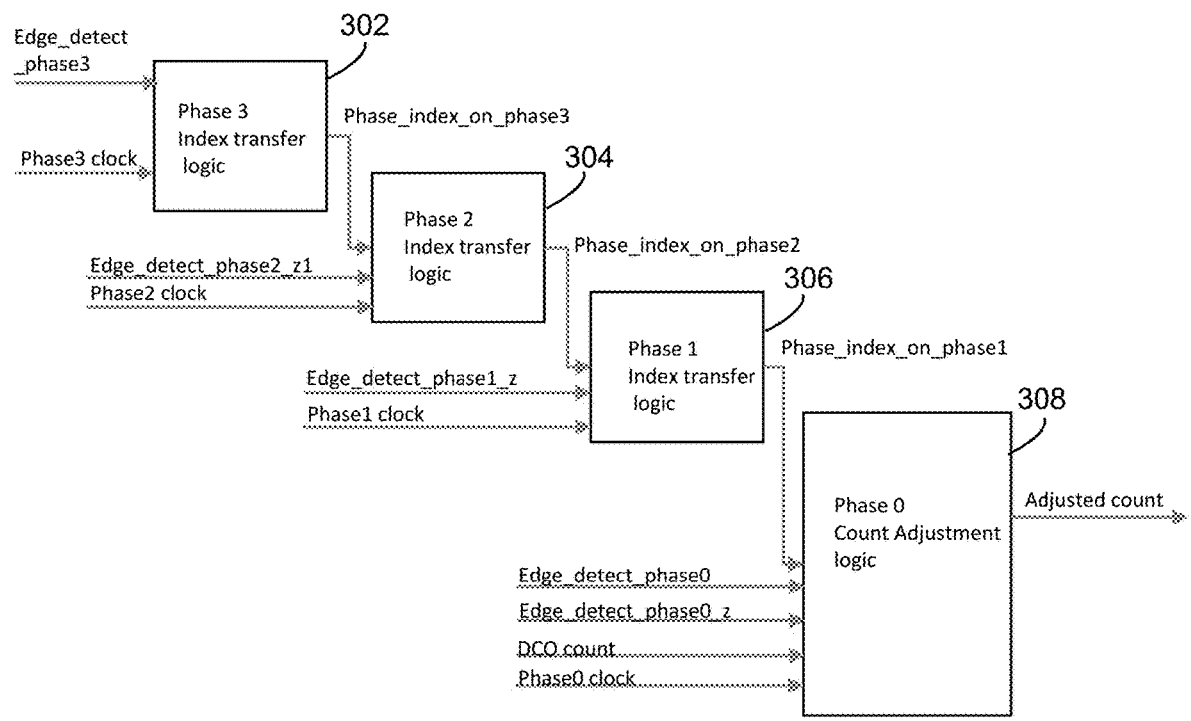
FIG. 3 illustrates the interconnection of transfer logic units employed in the TDC of FIG. 2.
Figure 4:
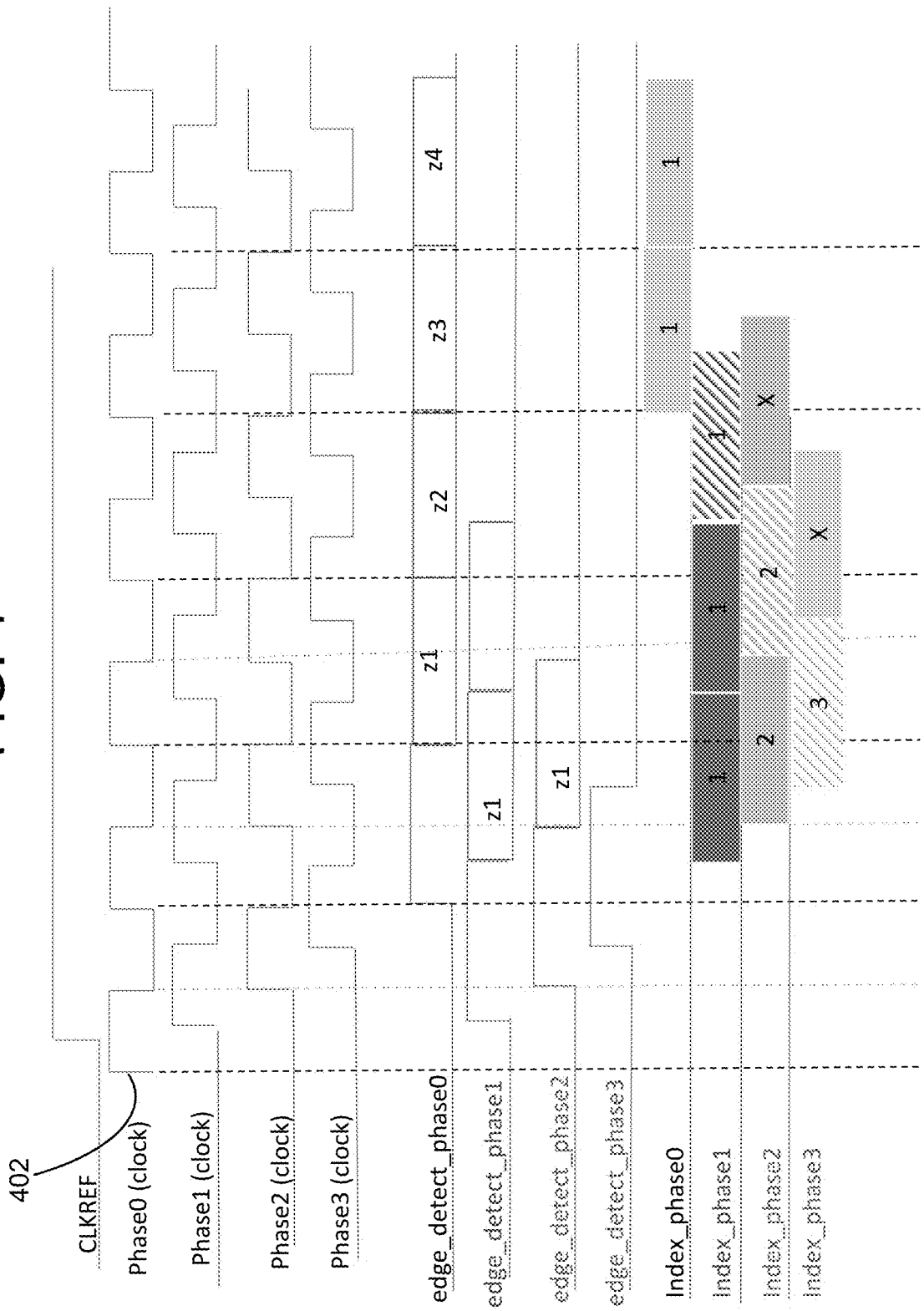
FIG. 4 illustrates a timing chart of various signal waveforms associated with operation of the TDC of FIG. 2.

FIG. 3 illustrates one specific embodiment of the phase adjust logic 208 (FIG. 2) in further detail, with corresponding timing information shown in FIG. 4. For clarity purposes, only four sampling clocks are employed, identified in FIG. 4 as Phase0, Phase1, Phase2, and Phase3. Receiving the edge detect signals and associated sampling clocks are multiple index transfer units, 302-308 (FIG. 3), although "N" such units could be employed in practice. The index transfer units are cascaded, with the first unit 302 carrying out an evaluation on a first sampling clock cycle of the Nth sampling clock, for this example Phase3, providing an output to the second unit 304, which carries out its evaluation on a next sampling clock cycle of the N−1th sampling clock, for this example Phase2, and so forth until all that is left is the master clock, for this example Phase0. A counter (not shown) is provided with the index transfer unit 308 associated with the master sampling clock, to keep track of a given interval for purposes of applying a phase adjustment. The interval, or count, begins at the rising edge of each master clock cycle, and increments by "N" each clock cycle. Generally, the cascaded index transfer units of the phase adjust logic evaluate the timing information provided by the edge detect signals in a sequential manner, within N time intervals of the master sampling clock, passing evaluated results from one unit to the next on each clock cycle, and eventually providing a phase adjustment for application to the master sampling clock phase.

Generally speaking, the number of clock cycles over which the index information is transferred depends on the implementation. While a fully pipelined embodiment for transferring the index information is described herein, all of the phase index information could alternatively be transferred on a single cycle, or somewhere between one cycle and the fully-pipelined scheme.

With continued reference to FIG. 3, for a first timing interval corresponding to one sampling clock cycle, the first index transfer unit 302 receives the edge detect signal associated with the Nth sampling clock, Phase3, which is clocked-in by the Nth sampling clock itself. The first transfer logic then determines whether the edge detect signal associated with sampling clock Phase3 triggered (exhibited a logic value of "1") before or after the edge detect signal for the master sampling clock (which begins the count period). An early result generally indicates that the particular sampling clock was the first of the sampling clocks to sample the valid region of the reference clock. This would mean that the master sampling clock sampled the reference clock late, providing error in the system if not adjusted. With that in mind, if the edge detect signal of Phase3 was triggered, then the index transfer unit generates a first index value representing a predetermined phase adjustment to be applied to the master sampling clock. For one specific embodiment, the index value is an integer value to be subtracted from the generated count of the counter, and based on the difference in phase between the master sampling clock and the Nth sampling clock, for this example "3". If the edge detect signal of Phase3 was not triggered, then the index transfer unit generates a "0." The index value is then transferred to the second index transfer unit 304 on the next cycle of Phase3. For one specific embodiment, the logic associated with the first index transfer unit may be expressed by:

---

Phase3 index transfer logic on phase 3 clock:
always @(phase3 clock edge)
    If (edge_detect_phase3) begin
        phase_index_on_phase3 = 3;
    else begin
        phase_index_on_phase3 = 0;
    end
end

---

Further referring to FIG. 3, the second index transfer unit 304 receives the index value from the first index transfer unit 302, along with the edge detect signal and sampling clock associated with the N−1th sampling clock Phase2. However, due to the sequential nature of the cascaded transfer units, the evaluation for the second index transfer unit takes place a sampling clock cycle later than the first unit. As a result, a version of the edge detect signal delayed by 1 cycle is employed, indicated by the label "edge_detect_phase2_z1, with the nomenclature "Z1" indicating a delay of one cycle. The second index transfer logic unit 304 performs an index evaluation similar to that of the first unit 302, based on the state of the delayed edge detect value, but also accumulates, or captures, the previous index information from the preceding index transfer unit 302 associated with the Nth sampling clock. For one specific embodiment, the logic associated with the second index transfer unit 304 may be expressed by:

---

Phase 2 index transfer logic on phase 2 clock:
always @(phase 2 clock edge)
    if (edge_detect_phase2_z1) begin
        phase_index_on_phase2 = 2;
    end begin
        phase_index_on_phase2 = phase_index_on_phase3;
    end
end

---

With continued reference to FIG. 3, the third (N−2th) index transfer unit 306 receives the accumulated index information from the second index transfer unit 304, along with the edge detect signal and sampling clock associated with the N−2th sampling clock Phase1. Since it is sequentially third in line, its edge detection signal "Edge_detect_phase1_z2" is delayed by two cycles, indicated by the nomenclature "z2." Like the second index logic unit, the third index logic unit 306 accumulates, or captures, the previous index information from the preceding index transfer unit 304 associated with the N−1th sampling clock. For one specific embodiment, the logic associated with the third index transfer unit 306 may be expressed by:

---

Phase 1 index transfer logic on phase 1 clock:
always @(phase 1 clock edge)
begin
    if (edge_detect_phase1_z2) begin
        phase_index_on_phase1 = 1;
    end begin
        phase_index_on_phase1 = phase index on phase2;
    end
end

---

Further referring to FIG. 3, the last stage 308 of the index transfer logic, corresponding to the master sampling phase, Phase0, acts as a phase adjustment stage. In this capacity it receives all of the forwarded, previously accumulated index information and determines which, if any, of the index values to use. This determination is based on the master sampling clock edge detection signal, "Edge_detect_phase0", a delayed version of the edge detect signal "Edge_detect_phase0_z2, a DCO count value "DCO_count", and the master sampling clock "Phase0." The index value that is sampled by the rising edge of the delayed version of the edge detect signal is used to adjust the master clock phase. For one specific embodiment, the logic associated with the master index transfer unit 308 may be expressed by:

```
Phase 0 count logic on phase 0 clock:
always @(phase0 clock edge)
begin
    if (edge_detect_phase0) begin
      sample counter;
    end else if (edge_detect_phase0_z2) begin
        if (phase_index_on_phase1 == 3) begin
            Count = count - 1; // adjust count by 1
        end else if (phase_index_on_phase1 == 2) begin
            Count = count - 2; // adjust count by 2
        end else if (phase_index_on_phase1 == 1) begin
            Count = count - 3; // adjust count by 3
        end
    end
end
```

FIG. 4 illustrates a timing chart for one example where four sampling clocks Phase0, Phase1, Phase2, and Phase3 are employed to sample a reference clock CLKREF. The phantom vertical lines indicate the rising edge of the master sampling clock Phase0, such as at 402. Resulting edge detect signals edge_detect_phase0, edge_detect_phase1, edge_detect_phase2, and edge_detect_phase3 show that for a first group of sampling clock signals (beginning with the rising edge of the first cycle of the master clock, at 402), the resulting edge detect signals indicate that the sampling clocks for Phase1, Phase2, and Phase3 all triggered early with respect to the master sampling clock Phase0. Again, triggering "early" denotes a given sampling clock sampling a logic "1" within a valid region of the reference clock signal before the master clock, during a sampling sequence beginning with the master sampling clock. Also, while the disclosure herein utilizes a rising edge for sampling, the falling edge may alternatively be employed, depending on the application.

Further referring to FIG. 4, the index transfer logic sequentially processes the edge detect signals by first looking at the signals associated with sampling clock Phase3, then Phase2, then Phase1. For this example, all three edge detect signals triggered, indicating that the three sampling clocks Phase3, Phase2, and Phase1 all sampled the positive pulse of the reference clock before the master sampling clock did. With all three index values associated with the three other sampling clocks accumulated and passed to the master phase index logic unit, the index value sampled by the edge detect signal associated with the master sampling clock, delayed by N−2 cycles, results in the index value for sampling clock Phase1 being selected. This value is then subtracted from the master sampling clock count, resulting in the master sampling count being adjusted by ¾ of a clock cycle.

Figure 5:
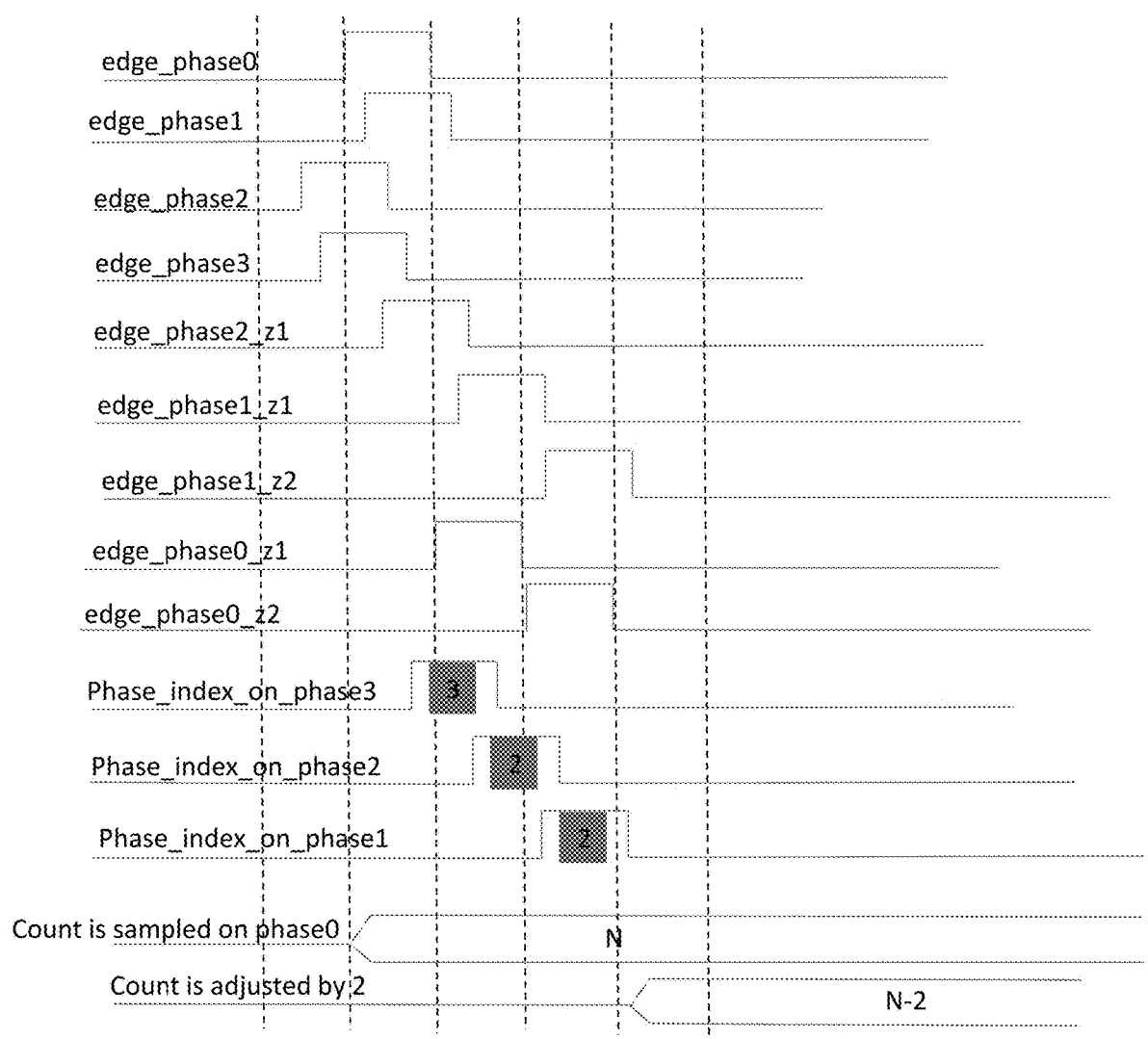
FIG. 5 illustrates a flowchart of steps for operating a TDC similar to that shown in FIG. 2.

FIG. 5 illustrates a further example similar to FIG. 3, but involving a sequence of edge detect signals in a sequence of 2, 3, 0, 1 (Phase2 triggering first, followed by Phase3, Phase0, Phase1). Again, using the rising edge of the master sampling clock, delayed by N−2 cycles (edge_phase0_z2), as the selection event for identifying a proper index value, the index associated with sampling clock Phase2 is used for adjusting the master sampling clock phase.

Figure 6:
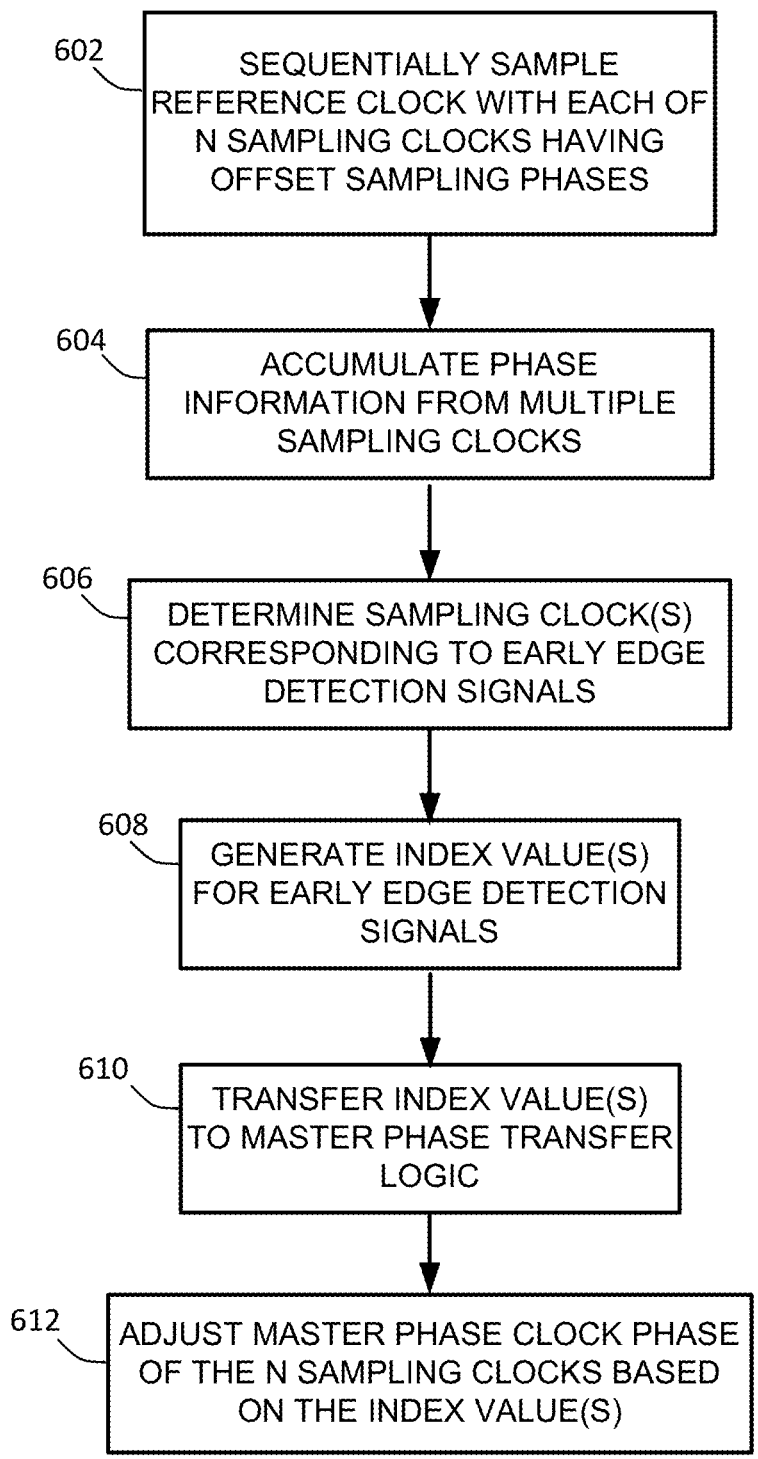
FIG. 6 illustrates steps for one embodiment of a method of synchronization.

FIG. 6 sets forth one embodiment of a method of synchronization consistent with the description set forth above. At 602, the sampling logic sequentially samples the reference clock with each of N sampling clocks having offset sampling phases. At 604, phase information from the multiple sampling clocks is accumulated or captured. Logic then determines whether any of the sampling clocks correspond to early edge detection signals, at 606. Index values are then generated for the early edge detection signals, at 608. At 610, the index values are transferred, to the master phase transfer logic. The master sampling clock phase is then adjusted based on the index value, at 612.

In some embodiments, to maximize the timing performance of the logic, i.e. to achieve the highest operating frequency, each of the sampling clock phases uses signals from its phase clock domain (i.e. phase N), and potentially the next phase (i.e. phase N−1). As an example, phase 0 will use signals generated with the phase0 clock, and possibly signals generated from the phase 3 clock (i.e. phase N−1). By limiting the signals in this way, the edge-to-edge timing is only shortened by 1/N of the clock period, whereas if all of the phase index information was analyzed on a single clock edge, then there would be timing paths from all of the phases to the phase0 clock domain.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

I claim:

1. A method of operation in a locked-loop circuit, the locked-loop circuit including a phase synchronization circuit to receive a reference clock with a first phase and a digitally-controlled oscillator (DCO) clock exhibiting a DCO clock phase, the method comprising:
   synchronizing the DCO clock phase to the reference clock phase, the synchronizing including
      sequentially sampling the reference clock with each of N sampling clocks having offset phases, a first one of the N sampling clocks comprising a master sampling clock;
      accumulating phase information from the multiple sampling clocks;
      determining, based on the accumulated phase information, whether any of the sampling clocks other than the master sampling clock correspond to edge detection signals that occurred early with respect to a rising edge of the master sampling clock;
      generating index values for any of the determined early edge detection signals, each index value corresponding to a phase difference between the master sampling clock phase and a given sampling clock phase associated with a corresponding early edge detection signal;
      transferring the generated index values to a master phase transfer logic unit; and
      adjusting the master clock phase based on a selected one of the generated index values.

2. The method of claim 1, wherein the selected one of the generated index values comprises:
   an index value associated with an edge detection signal sampled by the master phase clock at a specified number of sampling clock cycles from an initial sampling clock cycle.

3. The method of claim 1, further comprising:
   for each cycle of the master sampling clock, counting integer values from 1 to N to generate a count, the integer values representing phase increments within each sampling clock cycle corresponding to the offset phases of the sampling clocks.

4. The method of claim 3, wherein each index value represents a count offset value, and adjusting the master sampling clock phase comprises:
   subtracting the selected index value from the generated count.

5. The method of claim 1, wherein generating index values comprises:
   beginning with the Nth sampling clock,
      capturing edge time information with an Nth index transfer logic unit, the edge time information corresponding to whether the Nth sampling clock was associated with an early edge detection signal relative to the rising edge of the master sampling clock;
      conditionally assigning an index value based on the edge time information;
      sequentially transferring the conditionally assigned index value from the Nth index transfer logic unit to an N−1th index logic transfer unit associated with an N−1th sampling clock; and
   repeating the capturing, conditionally assigning, and sequentially transferring until an index transfer logic unit associated with the master sampling clock receives the conditionally assigned index value.

6. The method of claim 1, wherein the N sampling clocks are isochronous with respect to each other.

7. The method of claim 1, wherein the N sampling clocks are asynchronous with the reference clock.

8. A locked-loop circuit, comprising:
   phase synchronization circuitry to synchronize a DCO clock phase to a reference clock phase, the phase synchronization circuitry including
      sampling circuitry to sequentially sample the reference clock with each of N sampling clocks having offset phases, a first one of the N sampling clocks comprising a master sampling clock;
      edge detection logic to accumulate phase information from the multiple sampling clocks and determine, based on the accumulated phase information, whether any of the sampling clocks other than the master sampling clock correspond to edge detection signals that occurred early with respect to a rising edge of the master sampling clock;
      index logic to generate index values for any of the determined early edge detection signals, each index value corresponding to a phase difference between the master sampling clock phase and a given sampling clock phase associated with a corresponding early edge detection signal, the index logic to transfer the generated index values to a master phase transfer logic unit; and
      phase adjust logic to adjust the master clock phase based on a selected one of the generated index values.

9. The locked-loop circuit according to claim 8, wherein the selected one of the generated index values comprises:
   an index value associated with an edge detection signal sampled by the master phase clock at a specified number of sampling clock cycles from an initial sampling clock cycle.

10. The locked-loop circuit according to claim 8, further comprising:
    a counter to, for each cycle of the master sampling clock, increment integer values from 1 to N to generate a count, the integer values representing phase increments within each sampling clock cycle corresponding to the offset phases of the sampling clocks.

11. The locked-loop circuit according to claim 10, wherein each index value represents a count offset value, and phase adjust logic further comprises:
    logic to subtract the selected index value from the generated count.

12. The locked-loop circuit according to claim 8, wherein the index logic comprises:
    a first index logic unit corresponding to the Nth sampling clock; and
    N−1 subsequent index logic units sequentially coupled to the first index logic unit, the N−1 subsequent index logic units corresponding to the N−1 sampling clocks other than the Nth sampling clock.

13. The locked-loop circuit according to claim 8, wherein the sampling circuitry further comprises:
a ring oscillator to generate the N sampling clocks.

14. The locked-loop circuit according to claim 8, realized as a phase-locked loop.

15. A phase synchronization circuit for use in a phase-locked loop (PLL) circuit, comprising:
sampling circuitry to sequentially sample a reference clock with each of N sampling clocks having offset phases, a first one of the N sampling clocks comprising a master sampling clock;
edge detection logic to accumulate phase information from the multiple sampling clocks and determine, based on the accumulated phase information, whether any of the sampling clocks other than the master sampling clock correspond to edge detection signals that occurred early with respect to a rising edge of the master sampling clock;
index logic to generate index values for any of the determined early edge detection signals, each index value corresponding to a phase difference between the master sampling clock phase and a given sampling clock phase associated with a corresponding early edge detection signal, the index logic to transfer the generated index values to a master phase transfer logic unit; and
phase adjust logic to adjust the master clock phase based on a selected one of the generated index values.

16. The phase synchronization circuit of claim 15, wherein the selected one of the generated index values comprises:
an index value associated with an edge detection signal sampled by the master phase clock at a specified number of sampling clock cycles from an initial sampling clock cycle.

17. The phase synchronization circuit of claim 15, further comprising:
a counter to, for each cycle of the master sampling clock, increment integer values from 1 to N to generate a count, the integer values representing phase increments within each sampling clock cycle corresponding to the offset phases of the sampling clocks.

18. The phase synchronization circuit of claim 17, wherein each index value represents a count offset value, and phase adjust logic further comprises:
logic to subtract the selected index value from the generated count.

19. The phase synchronization circuit of claim 15, wherein the index logic comprises:
a first index logic unit corresponding to the Nth sampling clock; and
N−1 subsequent index logic units sequentially coupled to the first index logic unit, the N−1 subsequent index logic units corresponding to the N−1 sampling clocks other than the Nth sampling clock.

20. The phase synchronization circuit of claim 15, wherein the sampling circuitry further comprises:
a ring oscillator to generate the N sampling clocks.

* * * * *